US010490423B2

(12) United States Patent
Kim

(10) Patent No.: US 10,490,423 B2
(45) Date of Patent: Nov. 26, 2019

(54) FUME REMOVAL APPARATUS FOR SEMICONDUCTOR MANUFACTURING CHAMBER

(71) Applicant: Tae Wha Kim, Hwaseong-si (KR)

(72) Inventor: Tae Wha Kim, Hwaseong-si (KR)

( * ) Notice: Subject to any disclaimer, the term of this patent is extended or adjusted under 35 U.S.C. 154(b) by 0 days.

(21) Appl. No.: 15/508,560

(22) PCT Filed: Jan. 9, 2015

(86) PCT No.: PCT/KR2015/000270
§ 371 (c)(1),
(2) Date: Mar. 3, 2017

(87) PCT Pub. No.: WO2016/035946
PCT Pub. Date: Mar. 10, 2016

(65) Prior Publication Data
US 2017/0287740 A1 Oct. 5, 2017

(30) Foreign Application Priority Data

Sep. 5, 2014 (KR) .................. 20-2014-0006581 U
Nov. 19, 2014 (KR) .................. 20-2014-0008489 U

(51) Int. Cl.
*H01L 21/67* (2006.01)
(52) U.S. Cl.
CPC .............................. *H01L 21/67017* (2013.01)
(58) Field of Classification Search
CPC . B05B 16/60; C23C 16/4412; C23C 16/4408; C23C 16/56; C23C 16/455; B08B 15/00; H01L 21/67017
(Continued)

(56) References Cited

U.S. PATENT DOCUMENTS 5,076,205 A * 12/1991 Vowles ............. H01L 21/67184
118/715
5,997,642 A * 12/1999 Solayappan ........... B05D 1/007
118/50
(Continued)

FOREIGN PATENT DOCUMENTS

JP 63-246825 10/1988
JP 2000-54121 2/2000
(Continued)

OTHER PUBLICATIONS

English Machine Translation of KR 20070091407 A; from Espacenet.*
(Continued)

*Primary Examiner* — Reinaldo Sanchez-Medina
*Assistant Examiner* — Nicole Gardner
(74) *Attorney, Agent, or Firm* — Ladas & Parry, LLP

(57) ABSTRACT

Disclosed is a fume removal apparatus for a semiconductor manufacturing chamber. The disclosed fume removal apparatus for a semiconductor manufacturing chamber comprises: a fume exhaust pipe; a fume exhaust pipe opening-and-closing valve; a vacuum pump; and a control member, wherein the control member opens the fume exhaust pipe by opening the fume exhaust pipe opening-and-closing valve and forms a vacuum inside the fume exhaust pipe by operating the vacuum pump, so that fumes within the semiconductor manufacturing chamber can flow in along the fume exhaust pipe and be discharged to the outside. The disclosed fume removal apparatus for a semiconductor manufacturing chamber enables fumes to be rapidly, conveniently, and reliably removed from the semiconductor manufacturing chamber, and thus has an advantage of enabling a worker who should approach the inside of the semiconductor manufacturing chamber to safely perform work without coming into contact with the fumes.

12 Claims, 2 Drawing Sheets

(58) Field of Classification Search
USPC .......................................................... 118/326
See application file for complete search history.

(56) References Cited

U.S. PATENT DOCUMENTS

2005/0061245 A1     3/2005   Kim
2008/0064227 A1*    3/2008   Kim .................... C23C 16/4407
                                                                  438/787

FOREIGN PATENT DOCUMENTS

| JP | 2006-128341 | | 5/2006 |
| JP | 2009-177083 | | 8/2009 |
| KR | 1020050027296 A | | 3/2005 |
| KR | 10-2007-0014578 A | | 2/2007 |
| KR | 1020070065497 A | | 6/2007 |
| KR | 20070091407 A | * | 9/2007 |
| KR | 10-2013-0019931 A | | 2/2013 |

OTHER PUBLICATIONS

International Search Report Corresponding to PCT/KR2015/000270 dated Mar. 26, 2015.
Written Opinion Corresponding to PCT/KR2015/000270 dated Mar. 26, 2015.
Office Action dated Jul. 31, 2018 for Japanese Patent Application No. 2017-513030 and its English translation by Global Dossier.

* cited by examiner

[Fig. 1]
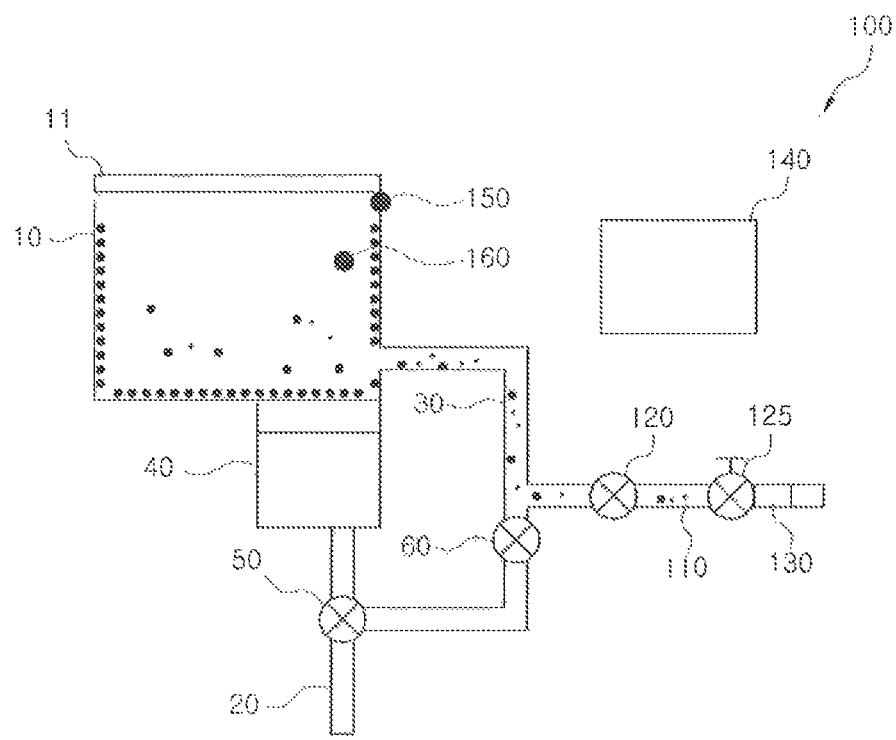
[Fig. 2]
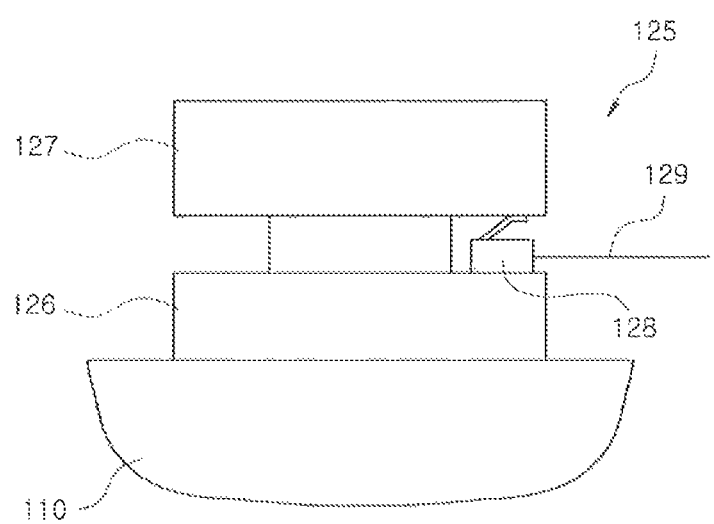

[Fig. 3]
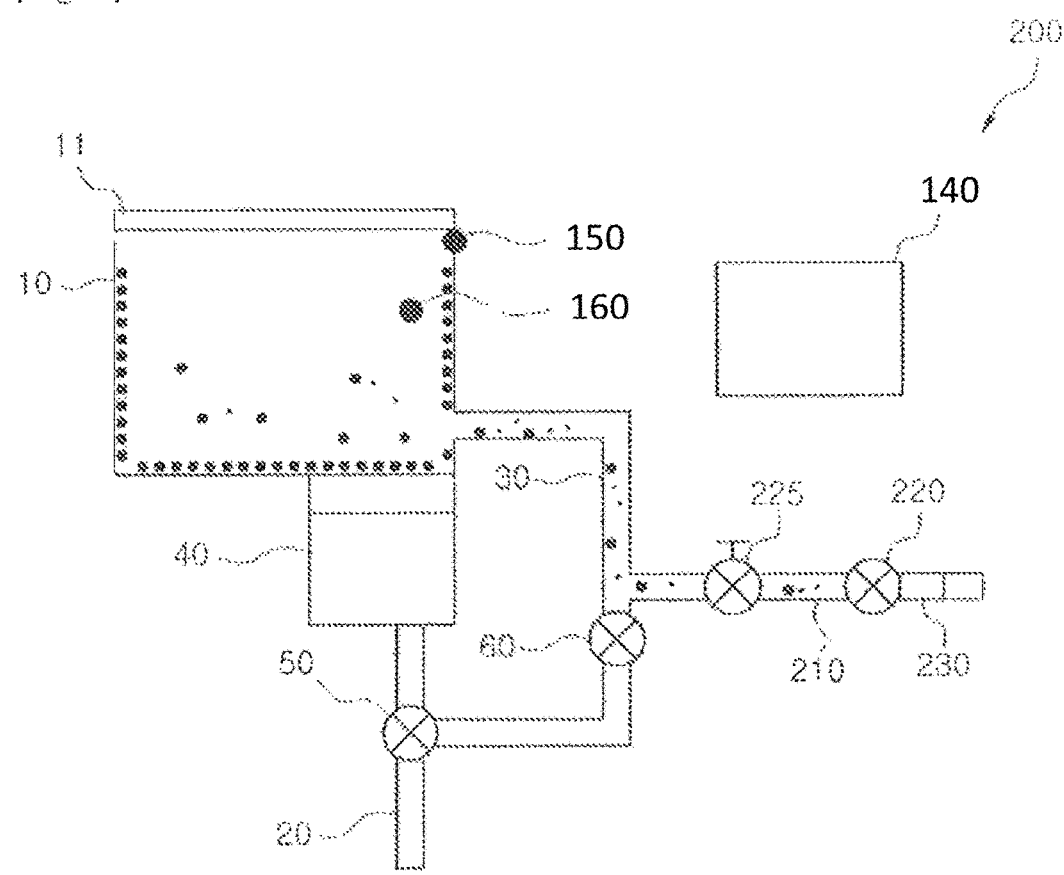

FUME REMOVAL APPARATUS FOR SEMICONDUCTOR MANUFACTURING CHAMBER

TECHNICAL FIELD

The present disclosure relates to a fume removal apparatus for a semiconductor manufacturing chamber.

BACKGROUND ART

An apparatus for manufacturing a semiconductor includes a semiconductor manufacturing chamber for performing respective processes. Various gases for performing the respective processes are injected into the semiconductor manufacturing chamber.

After the manufacturing process is completed, various byproducts may remain in the semiconductor manufacturing chamber. These byproducts may emit a heavy odor and contain a variety of toxic elements.

When a worker opens a chamber lid closing the semiconductor manufacturing chamber to clean or repair the interior of the semiconductor manufacturing chamber, large amounts of fumes may be generated from the byproducts remaining in the semiconductor manufacturing chamber. These fumes may contact and react with air to generate more fumes.

Although such fumes may contain very dangerous carcinogenic substances, able to cause various cancers in the human body, existing semiconductor manufacturing chambers do not have proper structures for removing fumes. Accordingly, there has been a problem in that workers may be exposed to potentially fatal fumes. Due to this problem, there has been an inconvenience for workers, in the need to wear protective devices such as masks and protective clothing. The problem of pollution of a surrounding areas caused by the fumes has also not been solved.

In order to overcome these problems, after the chamber lid is open, fumes have been removed through a separate local exhaust device by disposing a hood in the place of the existing semiconductor manufacturing chamber lids, while the chamber lid is open, the hood being connected to the separate local exhaust device.

However, according to such an existing method, it is necessary to remove the hood connected to the separate local exhaust device in order to perform a cleaning operation or a repair operation on the interior of the semiconductor manufacturing chamber. At this time, while the fumes remaining in the semiconductor manufacturing chamber leak from the chamber, the leaked fumes may exert a negative influence on a body of the worker and pollute a surrounding environment. At the time of removing the hood, it is necessary to prepare and connect the separate local exhaust device, and, after the separate local exhaust device is used, it is necessary to separate and arrange the separate local exhaust device. Accordingly, there has been a limitation in that a significant amount of time is spent in connecting and separating the separate local exhaust device compared to a time before and after the separate local exhaust device is operated to remove the fumes.

In addition, since a work space for performing the cleaning operation and the repairing operation is mostly small, the addition of the separate local exhaust device may disturb work of a worker and it may be inconvenient to move the separate local exhaust device.

Furthermore, due to damage, a defect, a breakdown, and the like of the separate local exhaust device, maintenance costs may be increased, and due to a large volume of the separate local exhaust device itself, the separate local exhaust device may be difficult to store.

DISCLOSURE

Technical Problem

The present disclosure proposes a fume removal apparatus for a semiconductor manufacturing chamber, the fume removal apparatus being able to rapidly, conveniently, and reliably remove fumes from the semiconductor manufacturing chamber.

Technical Solution

According to an aspect of the present disclosure, a fume removal apparatus for a semiconductor manufacturing chamber may include: a fume exhaust pipe communicating with a semiconductor manufacturing chamber to form an initial vacuum in the semiconductor manufacturing chamber and having a shape protruding from a bypass pipe and communicating with the bypass pipe in which a roughing valve is formed; a fume exhaust pipe opening-and-closing valve disposed on the fume exhaust pipe to open and close the fume exhaust pipe; a vacuum pump connected to the fume exhaust pipe to form a vacuum in the fume exhaust pipe; and a control member controlling an operation of each of the fume exhaust pipe opening-and-closing valve and the vacuum pump.

When fumes are required to be removed from the semiconductor manufacturing chamber, the control member opens the fume exhaust pipe opening-and-closing valve to open the fume exhaust pipe and operates the vacuum pump to form a vacuum in the fume exhaust pipe, so that the fumes in the semiconductor manufacturing chamber are discharged externally through the fume exhaust pipe.

According to another aspect of the present disclosure, a fume removal apparatus for a semiconductor manufacturing chamber may include: a fume exhaust pipe communicating with the semiconductor manufacturing chamber to form an initial vacuum in the semiconductor manufacturing chamber and having a shape protruding from a bypass pipe and communicating with the bypass pipe in which a roughing valve is formed; a manual valve disposed on the fume exhaust pipe and operated by external force to open and close the fume exhaust pipe; a manual valve operation sensing member sensing whether or not the manual valve is operated; a vacuum pump connected to the fume exhaust pipe to form a vacuum in the fume exhaust pipe; and a control member controlling an operation of the vacuum pump, When the manual valve operation sensing member senses that the manual valve opens the fume exhaust pipe, the control member operates the vacuum pump to form a vacuum in the fume exhaust pipe, so that fumes in the semiconductor manufacturing chamber are discharged externally through the fume exhaust pipe.

According to further another aspect of the present disclosure, a fume removal apparatus for a semiconductor manufacturing chamber may include: a fume exhaust pipe communicating with the semiconductor manufacturing chamber to form an initial vacuum in the semiconductor manufacturing chamber and having a shape protruding from a bypass pipe and communicating with the bypass pipe in which a roughing valve is formed; a fume exhaust pipe opening-and-closing valve disposed on the fume exhaust pipe to open and close the fume exhaust pipe; a vacuum pump connected to the fume exhaust pipe to form a vacuum in the fume exhaust pipe; a control member controlling an operation of each of the fume exhaust pipe opening-and-closing valve and the vacuum pump; a lid opening-and-closing sensing member sensing whether or not a chamber lid opening and closing the semiconductor manufacturing chamber is opened or closed; and a pressure sensing member sensing pressure in the semiconductor manufacturing chamber.

When fumes are required to be removed from the semiconductor manufacturing chamber, the control member opens the fume exhaust pipe opening-and-closing valve to open the fume exhaust pipe and operates the vacuum pump to form a vacuum in the fume exhaust pipe, so that the fumes in the semiconductor manufacturing chamber are discharged externally through the fume exhaust pipe.

When the lid opening-and-closing sensing member senses that the chamber lid is open and the pressure sensing member senses that pressure in the semiconductor manufacturing chamber is equal to atmospheric pressure, the control member opens the fume exhaust pipe and operates the vacuum pump.

Advantageous Effects

As set forth above, according to a fume removal apparatus for a semiconductor manufacturing chamber according to an aspect of the present disclosure, when fumes are required to be removed from the semiconductor manufacturing chamber, a fume exhaust pipe is opened and a vacuum pump is operated to discharge the fumes from the semiconductor manufacturing chamber through the fume exhaust pipe. Accordingly, the fumes can be rapidly, conveniently, and reliably removed from the semiconductor manufacturing chamber, and as a result, a worker who must enter the semiconductor manufacturing chamber may safely work without coming into contact with the fumes.

DESCRIPTION OF DRAWINGS

FIG. 1 is a schematic view illustrating a configuration of a fume removal apparatus for a semiconductor manufacturing chamber according to a first embodiment of the present disclosure;

FIG. 2 is a view illustrating a manual valve applied to a fume removal apparatus for a semiconductor manufacturing chamber according to a first embodiment of the present disclosure; and FIG. 3 is a schematic view illustrating a configuration of a fume removal apparatus for a semiconductor manufacturing chamber according to a second embodiment of the present disclosure.

BEST MODE

Hereinafter, a fume removal apparatus for a semiconductor manufacturing chamber according to embodiments of the present disclosure will be described with reference to the accompanying drawings.

FIG. 1 is a schematic view illustrating a configuration of a fume removal apparatus for a semiconductor manufacturing chamber, according to a first embodiment of the present disclosure, while FIG. 2 is a view illustrating a manual valve applied to the fume removal apparatus for the semiconductor manufacturing device, according to a first embodiment of the present disclosure.

Referring to FIGS. 1 and 2, a fume removal apparatus 100 for a semiconductor manufacturing chamber according to an aspect of the present embodiment includes a fume exhaust pipe 110, a fume exhaust pipe opening-and-closing valve 120, a vacuum valve or pump 130, and a control member 140.

Reference numeral 10 indicates the semiconductor manufacturing chamber. Reference numeral 11 indicates a chamber lid able to open and close an upper opening of the semiconductor manufacturing chamber 10. Reference numeral 40 indicates a turbo pump able to form a vacuum in the semiconductor manufacturing chamber 10. Reference numeral 20 indicates an exhaust pipe connected to the turbo pump 40 to discharge air. Reference numeral 30 indicates a bypass pipe connected to the semiconductor manufacturing chamber 10 to communicate with the semiconductor manufacturing chamber 10 separately from the exhaust pipe 20. Reference numeral 50 indicates an ISO valve to which the exhaust pipe 20 and the bypass pipe 30 are connected. Reference numeral 60 indicates a roughing valve disposed on the bypass pipe 30 to form an initial vacuum in the semiconductor manufacturing chamber 10.

Here, the chamber lid 11 is provided as a means for opening and closing the upper opening of the semiconductor manufacturing chamber 10, but this is a mere example. The chamber lid 11 may be configured to open and close other portions of the semiconductor manufacturing chamber 10, such as a side opening and may also open and close various portions such as the upper opening and the side opening of the semiconductor manufacturing chamber 10 at the same time.

The fume exhaust pipe 110 has a shape extending from the bypass pipe 30 and communicating with the bypass pipe 30.

The fume exhaust pipe opening-and-closing valve 120 may be disposed on the fume exhaust pipe 110 to open and close the fume exhaust pipe 110. An air valve or the like may be provided as the fume exhaust pipe opening-and-closing valve 120.

The vacuum valve or pump 130 may be connected to the fume exhaust pipe 110 to form a vacuum in the fume exhaust pipe 110.

The control member 140 may control operations of the fume exhaust pipe opening-and-closing valve 120 and the vacuum valve or pump 130, respectively.

In addition, the fume removal apparatus 100 for the semiconductor manufacturing chamber includes a lid opening-and-closing sensing member 150 sensing the opening and closing of the chamber lid 11 that open and close the semiconductor manufacturing chamber 10.

According to the configuration as described above, when the lid opening-and-closing sensing member 150 senses that the chamber lid 11 is open, the control member 140 may open the fume exhaust pipe 110 and operate the vacuum valve or pump 130 by determining that fumes are required to be removed from the semiconductor manufacturing chamber 10.

In addition, the fume removal apparatus 100 for the semiconductor manufacturing chamber may further include a pressure sensing member 160 sensing pressure in the semiconductor manufacturing chamber 10.

According to the configuration as described above, when the pressure sensing member 160 senses that internal pressure of the semiconductor manufacturing chamber 10 is equal to atmospheric pressure, the control member 140 may open the fume exhaust pipe 110 and operate the vacuum valve or pump 130 by determining that fumes are required to be removed from the semiconductor manufacturing chamber 10.

Here, the fume removal apparatus 100 for the semiconductor manufacturing chamber may include both of the lid opening-and-closing sensing member 150 and the pressure sensing member 160.

According to the configuration as described above, when the lid opening-and-closing sensing member 150 senses that the chamber lid 11 is open and the pressure sensing member 160 senses that the internal pressure of the semiconductor manufacturing chamber 10 is equal to atmospheric pressure, the control member 140 may open the fume exhaust pipe 110 and operate the vacuum valve or pump 130 by determining that fumes are required to be removed from the semiconductor manufacturing chamber 10.

Specifically, the control member 140 opens the fume exhaust pipe 110 by opening the fume exhaust pipe opening-and-closing valve 120 and forms a vacuum in the fume exhaust pipe 110 by operating the vacuum valve or pump 130. Then, as the bypass pipe 30 and the semiconductor manufacturing chamber 10, sequentially communicating with the fume exhaust pipe 110, are sequentially vacuumized, fumes in the semiconductor manufacturing chamber 10 may be introduced into and travel through the fume exhaust pipe 110, and then, may be discharged externally.

As described above, when fumes are required to be removed from the semiconductor manufacturing chamber 10, the fume exhaust pipe 110 may be opened and the vacuum valve or pump 130 may be operated. The fumes in the semiconductor manufacturing chamber 10 may be discharged externally through the fume exhaust pipe 110, so that the fumes may be rapidly, conveniently, and reliability removed from the semiconductor manufacturing chamber 10. Accordingly, a worker who should enter the semiconductor manufacturing chamber 10 may safely work without coming into contact with the fumes.

Here, when the chamber lid 11 is open, the fume exhaust pipe 110 and the vacuum valve or pump 130 have been disclosed as being opened and operated, respectively. However, the present disclosure is not limited thereto, and fumes may be removed even when the chamber lid 11 is closed.

On the other hand, a fume removal apparatus 100 for a semiconductor manufacturing chamber according to another aspect of the present embodiment includes the fume exhaust pipe 110, a manual valve 125, a manual valve operation sensing member 128, the vacuum valve or pump 130, and the control member 140.

Reference numeral 129 indicates a signal cable.

The manual valve 125 may be disposed on the fume exhaust pipe 110 and may be manually operated by external force to open and close the fume exhaust pipe 110.

The manual valve 125 includes a manual valve body 126 including a blocking plate (not shown) able to open and close the fume exhaust pipe 110 and a valve handle 127 rotatable on the manual valve body 126 by external force applied by an worker (by hand) such that the blocking plate of the valve body 126 is moved to close/open the fume exhaust pipe 110.

The manual valve operation sensing member 128 is able to sense whether or not the manual valve 125 operates. The signal cable 129 is provided to connect the manual valve operation sensing member 128 and the control member 140 such that a signal is transmitted therebetween.

A switch-type sensor may be proposed as an example of the manual valve operation sensing member 128. An example of the switch-type sensor may include a general switch-type sensor including a sensor body that is fixed to the manual valve body 126 and a metal bar that protrudes from the sensor body, has elasticity, and returns to an initial state in a state of being pushed by the valve handle 127 to accumulate elastic force, as the valve handler 127 is rotated and lifted. When the metal bar returns to the initial state, the general switch-type sensor transmits a signal through the signal cable 129, the signal informing that the operation of the valve handle 127 is sensed.

As the valve handler 127 is forwardly rotated and lifted by a worker, the manual valve operation sensing member 128 senses that the manual valve 125 opens the fume exhaust pipe 110. When a sensing signal is transmitted to the control member 140 through the signal cable 129, the control member 140 forms a vacuum in the fume exhaust pipe 110 by operating the vacuum pump 130, so that the fumes in the semiconductor manufacturing chamber 10 are discharged externally through the fume exhaust pump 110.

In contrast, as the valve handler 127 is reversely rotated and lowered by the worker, the manual valve operation sensing member 128 senses that the manual valve 125 closes the fume exhaust pipe 110. When a sensing signal is transmitted to the control member 140 through the signal cable 129, the control member 140 stops the operation of the vacuum pump 130.

As described above, as the fume exhaust pipe 110 is manually opened and closed through the operation of the manual valve 125 and the manual valve operation sensing member 128 senses whether or not the fume exhaust pipe 110 is opened or closed, the operation of the vacuum pump 130 may be controlled according to sensed values. Accordingly, fumes may be removed through a simple structure.

When the manual valve operation sensing member 128 senses that the manual valve 125 opens the fume exhaust pipe 110 and the lid opening-and-closing sensing member 150 also senses that the fume exhaust pipe 110 is open, the control member 140 may be configured to operate the vacuum pump 130.

On the other hand, the manual valve 125 may open and close the fume exhaust pipe 110 even when the fume removal apparatus 100 for the semiconductor manufacturing chamber malfunctions. For example, the worker may close the manual valve 125 when the fume removal apparatus 100 for the semiconductor manufacturing chamber malfunctions.

The manual valve 125 and the vacuum valve 130 may be integrated into a single unit and only the vacuum pump 130 may be separately applied to be detachably disposed.

Mode for Invention

A description of a fume removal apparatus for a semiconductor manufacturing chamber according to another embodiment of the present disclosure is given below. In the following disclosure, descriptions of some components and functions will be omitted, since they are identical to the above-provided description of the foregoing embodiment of the present disclosure.

FIG. 3 is a schematic view illustrating a configuration of a fume removal device 200 for a semiconductor manufacturing device, according to a second embodiment of the present disclosure.

Referring to FIG. 3, in the present embodiment, a fume exhaust pipe opening-and-closing valve 220 is configured to be integrated into a single unit, together with a vacuum pump 230, rather than a manual valve 225.

While the present disclosure has been illustrated and described with respect to specific exemplary embodiments, it will be apparent to a person having ordinary skill in the art that many modifications and variations are possible without departing from spirits and scopes of the present disclosure defined by appended claims. It is definitely noted that such modifications and variations are included within the scope of the present disclosure.

INDUSTRIAL APPLICABILITY

According to a fume removal apparatus for a semiconductor manufacturing chamber according to an aspect of the present disclosure, it is possible to rapidly and reliability remove fumes from a semiconductor manufacturing chamber, and thus, the fume removal apparatus may have high industrial applicability.

The invention claimed is:

1. A fume removal apparatus for a semiconductor manufacturing chamber, the fume removal apparatus comprising:
a turbo pump connected to the semiconductor manufacturing chamber to form a vacuum in the semiconductor manufacturing chamber;
an exhaust pipe connected to the turbo pump to discharge air;
a bypass pipe connected to the semiconductor manufacturing chamber at a different position from a position the turbo pump is connected to the semiconductor manufacturing chamber;
a roughing valve disposed on the bypass pipe;
a fume exhaust pipe branched from the bypass pipe and communicating with the bypass pipe to form an initial vacuum in the semiconductor manufacturing chamber and discharge fumes;
a fume exhaust pipe opening-and-closing valve disposed on the fume exhaust pipe to open and close the fume exhaust pipe;
a vacuum pump connected to the fume exhaust pipe to form a vacuum in the fume exhaust pipe;
an ISO valve disposed at a junction where the exhaust pipe and the bypass pipe are coupled; and
a control member controlling an operation of each of the fume exhaust pipe opening-and-closing valve and the vacuum pump,
wherein, when fumes are required to be removed from the semiconductor manufacturing chamber, the control member opens the fume exhaust pipe opening-and-closing valve to open the fume exhaust pipe and operates the vacuum pump to form a vacuum in the fume exhaust pipe, so that the fumes in the semiconductor manufacturing chamber are discharged externally through the fume exhaust pipe,
the roughing valve is disposed downstream of a point where the fume exhaust pipe is branched from the bypass pipe, and
the exhaust pipe and the fume exhaust pipe have different outlets from each other to discharge the air and the fumes, respectively.

2. The fume removal apparatus of claim 1, further comprising a lid opening-and-closing sensing member sensing whether or not a chamber lid opening and closing the semiconductor manufacturing chamber is opened or closed, wherein, when the lid opening-and-closing sensing member senses that the chamber lid is open, the control member operates the vacuum pump.

3. The fume removal apparatus of claim 1, wherein the ISO valve is connected to the turbo pump, the exhaust pipe and the bypass pipe.

4. The fume removal apparatus of claim 1, wherein:
the exhaust pipe is connected to the semiconductor manufacturing chamber through the turbo pump to discharge the air, and
the bypass pipe is connected to the semiconductor manufacturing chamber separately from the exhaust pipe.

5. A fume removal apparatus for a semiconductor manufacturing chamber, the fume removal apparatus comprising:
a turbo pump connected to the semiconductor manufacturing chamber to form a vacuum in the semiconductor manufacturing chamber;
an exhaust pipe connected to the turbo pump to discharge air;
a bypass pipe connected to the semiconductor manufacturing chamber at a different position from a position where the turbo pump is connected to the semiconductor manufacturing chamber;
a roughing valve disposed on the bypass pipe;
a fume exhaust pipe branched from the bypass pipe and communicating with the bypass pipe to form an initial vacuum in the semiconductor manufacturing chamber and discharge fumes;
a manual valve disposed on the fume exhaust pipe and operated by external force to open and close the fume exhaust pipe;
a manual valve operation sensing member sensing whether or not the manual valve is operated;
a vacuum pump connected to the fume exhaust pipe to form a vacuum in the fume exhaust pipe;
an ISO valve disposed at a junction where the exhaust pipe and the bypass pipe are coupled; and
a control member controlling an operation of the vacuum pump, wherein,
when the manual valve operation sensing member senses that the manual valve opens the fume exhaust pipe, the control member operates the vacuum pump to form a vacuum in the fume exhaust pipe, so that fumes in the semiconductor manufacturing chamber are discharged externally through the fume exhaust pipe,
the roughing valve is disposed downstream of a point where the fume exhaust pipe is branched from the bypass pipe, and
the exhaust pipe and the fume exhaust pipe have different outlets from each other to discharge the air and the fumes, respectively.

6. The fume removal apparatus of claim 5, further comprising a lid opening-and-closing sensing member sensing whether or not a chamber lid opening and closing the semiconductor manufacturing chamber is opened or closed, wherein, when the lid opening-and-closing sensing member senses that the chamber lid is open, the control member operates the vacuum pump.

7. The fume removal apparatus of claim 5, wherein the ISO valve is connected to the turbo pump, the exhaust pipe and the bypass pipe.

8. The fume removal apparatus of claim 5, wherein:
the exhaust pipe is connected to the semiconductor manufacturing chamber through the turbo pump to discharge the air, and
the bypass pipe is connected to the semiconductor manufacturing chamber separately from the exhaust pipe.

9. A fume removal apparatus for a semiconductor manufacturing chamber, the fume removal apparatus comprising:
a turbo pump connected to the semiconductor manufacturing chamber to form a vacuum in the semiconductor manufacturing chamber;
an exhaust pipe connected to the turbo pump to discharge air;

a bypass pipe connected to the semiconductor manufacturing chamber at a different position from a position the turbo pump is connected to the semiconductor manufacturing chamber;

a roughing valve disposed on the bypass pipe;

a fume exhaust pipe branched from the bypass pipe and communicating with the bypass pipe to form an initial vacuum in the semiconductor manufacturing chamber and discharge fumes;

a fume exhaust pipe opening-and-closing valve disposed on the fume exhaust pipe to open and close the fume exhaust pipe;

a vacuum pump connected to the fume exhaust pipe to form a vacuum in the fume exhaust pipe;

a control member controlling an operation of each of the fume exhaust pipe opening-and-closing valve and the vacuum pump;

a lid opening-and-closing sensing member sensing whether or not a chamber lid opening and closing the semiconductor manufacturing chamber is opened or closed;

a pressure sensing member sensing pressure in the semiconductor manufacturing chamber; and an ISO valve disposed at a junction where the exhaust pipe and the bypass pipe are coupled, wherein, when fumes are required to be removed from the semiconductor manufacturing chamber, the control member opens the fume exhaust pipe opening-and-closing valve to open the fume exhaust pipe and operates the vacuum pump to form a vacuum in the fume exhaust pipe, so that the fumes in the semiconductor manufacturing chamber are discharged externally through the fume exhaust pipe, and when the lid opening-and-closing sensing member senses that the chamber lid is open and the pressure sensing member senses that pressure in the semiconductor manufacturing chamber is equal to atmospheric pressure, the control member opens the fume exhaust pipe and operates the vacuum pump, the roughing valve is disposed downstream of a point where the fume exhaust pipe is branched from the bypass pipe, and the exhaust pipe and the fume exhaust pipe have different outlets from each other to discharge the air and the fumes, respectively.

10. The fume removal apparatus of claim 9, further comprising a manual valve disposed on the fume exhaust pipe to close the fume exhaust pipe when the fume removal apparatus for the semiconductor manufacturing chamber malfunctions.

11. The fume removal apparatus of claim 9, wherein the ISO valve is connected to the turbo pump, the exhaust pipe and the bypass pipe.

12. The fume removal apparatus of claim 9, wherein:

the exhaust pipe is connected to the semiconductor manufacturing chamber through the turbo pump to discharge the air, and the bypass pipe is connected to the semiconductor manufacturing chamber separately from the exhaust pipe.

* * * * *